United States Patent [19]

Cooke et al.

[11] Patent Number: 5,010,374
[45] Date of Patent: Apr. 23, 1991

[54] QUANTUM WELL LASER UTILIZING AN INVERSION LAYER

[75] Inventors: Paul W. Cooke, Fair Haven; Geoffrey W. Taylor, Holmdel, both of N.J.

[73] Assignee: AT&T Bell Laboratories, Murray Hill, N.J.

[21] Appl. No.: 533,549

[22] Filed: Jun. 5, 1990

[51] Int. Cl.$^5$ .................. H01L 29/161; H01L 33/00; H01S 3/19
[52] U.S. Cl. ..................................... 357/16; 357/18; 357/61; 357/34; 372/45
[58] Field of Search ....................... 357/16, 18, 34, 61; 372/45

[56] References Cited

U.S. PATENT DOCUMENTS

| | | | |
|---|---|---|---|
| 4,686,550 | 8/1987 | Capasso et al. | 357/16 |
| 4,800,415 | 1/1989 | Simmons et al. | 357/16 |
| 4,806,997 | 2/1989 | Simmons et al. | |
| 4,882,734 | 11/1989 | Scifres et al. | 357/16 |
| 4,887,274 | 12/1989 | Hayakawa et al. | |

OTHER PUBLICATIONS

Fujii, T., et al., "MBE Growth of Extremely High-Quality GaAs-AlGaAs GRINSCH Lasers with a Superlattice Buffer Layer", J. Vac. Sci. Technol. B., vol. 3, No. 2, Mar./Apr. 1985, pp. 776-778.

Taylor, G. W., et al., "Double-Heterostructure Optoelectronic Switch as a Single Quantum Well Laser", Appl. Phys. Lett. 56 (14), 2 Apr. 1990, pp. 1308-1310.

Taylor, G. W., et al., "A Single Quantum Well DOES Laser for Optical Computing", LEOS Conference, Orlando, FL, Oct. 17, 1989, pp. 60-61.

Derry, P. L., et al., "Ultralow Threshold Graded-Index Separate-Confinement Heterostructure Single Quantum Well (Al,Ga)As Lasers", J. Vac. Sci. Technol. B 6 (2), Mar./Apr. 1988, pp. 689-691.

Primary Examiner—Edward J. Wojchiechowicz

[57] ABSTRACT

A quantum well laser exhibiting near ideal switching characteristics, high power conversion efficiency and, moreover, capable of utilizing the advantageous characteristics of a double heterostructure optoelectronic switch comprises a quantum well region disposed between carrier confinement regions. In particular, the interface between the qunatum well regioin and a confinement region is adapted to the formation of an inversion layer.

9 Claims, 4 Drawing Sheets

QUANTUM WELL LASER UTILIZING AN INVERSION LAYER

This invention was made with Government support under contract No. F33615-87-C-1444 awarded by Wright Patterson Air Force Base. The Government has certain rights in this invention.

TECHNICAL FIELD

This invention relates to the field of semiconductor devices and, more particularly, quantum well lasers.

CROSS-REFERENCE TO RELATED APPLICATION

This application is related to U.S. patent application Ser. No. 533,636 (P. A. Kiely Case 1-7), which was filed concurrently herewith.

BACKGROUND OF THE INVENTION

Optical computing, which is based on beam propagation properties of mutually noninteracting photons, has the potential of performing information processing several orders of magnitude greater than its electronic counterpart. However, to fulfill this expectation, non-linear optical devices must be developed that perform logical operations on either optical or electrical input information and output the processed information optically or electrically. In particular, these optical devices must be compact, consume small power, exhibit large optical gain, and, importantly, must be integratable in order to achieve high density.

A solid state device, termed a DOES (which is an acronym for a Double Heterostructure Opto-Electronic Switch) has recently been developed by one of the inventors which potentially can satisfy all of the above criterion. See U.S. Pat. No. 4,806,997 which is incorporated herein by reference. Specifically, the DOES, which is based upon an induced inversion layer at a heterojunction interface, is an electrically and optically bistable device which may be switched between states by either an electrical or optical input. In a first state, the device has a high electrical impedance and emits no light, while in a second state, the device has a low impedance and strongly emits optical radiation.

The initial implementation of the DOES was in a surface emitting light-emitting diode (LED) form. While the abovementioned device is advantageous in that its unique electrical and optical characteristics make it extremely attractive for digital optical operations, it would be further desirable to improve the power conversion efficiency as well as the beam collimation thereof.

SUMMARY OF THE INVENTION

A quantum well laser exhibiting near ideal switching characteristics, high power conversion efficiency and, moreover, capable of utilizing the advantageous characteristics of a double heterostructure optoelectronic switch comprises a quantum well region disposed between carrier confinement regions. In particular, the interface between the quantum well region and a carrier confinement region is adapted to the formation of an inversion layer.

In an exemplary embodiment, a GaAs single quantum well is fabricated between upper and lower, graded AlGaAs barrier regions, that are carrier confinement regions. At the interface between the upper barrier region and the quantum well region, a charge sheet having a conductivity type opposite to the upper barrier region is placed therebetween, which produces an inversion channel within the quantum well region. This inversion channel provides the mechanism for lasing if an optical cavity is properly formed such as by providing optical feedback and waveguide confinement. In the preferred embodiment, waveguide confinement was provided by high refractive index AlGaAs regions adjacent to both the upper and lower carrier confinement regions.

BRIEF DESCRIPTION OF THE DRAWING

A more complete understanding of the invention may be obtained by reading the following description in conjunction with the appended drawing in which.

DETAILED DESCRIPTION

The invention is a quantum well laser that utilizes an inversion layer at the interface between a quantum well region and a carrier confinement region. Importantly, the novel laser is capable of utilizing a double heterostructure optoelectronic switch (DOES) structure which advantageously allows the device to operate as a conventional graded index quantum well laser, while at the same time maintaining the unique electrical and optical switching characteristics of the DOES. This unique combination affords the potential for producing optoelectronic integrated circuits for digital optical processing.

Figure 1:
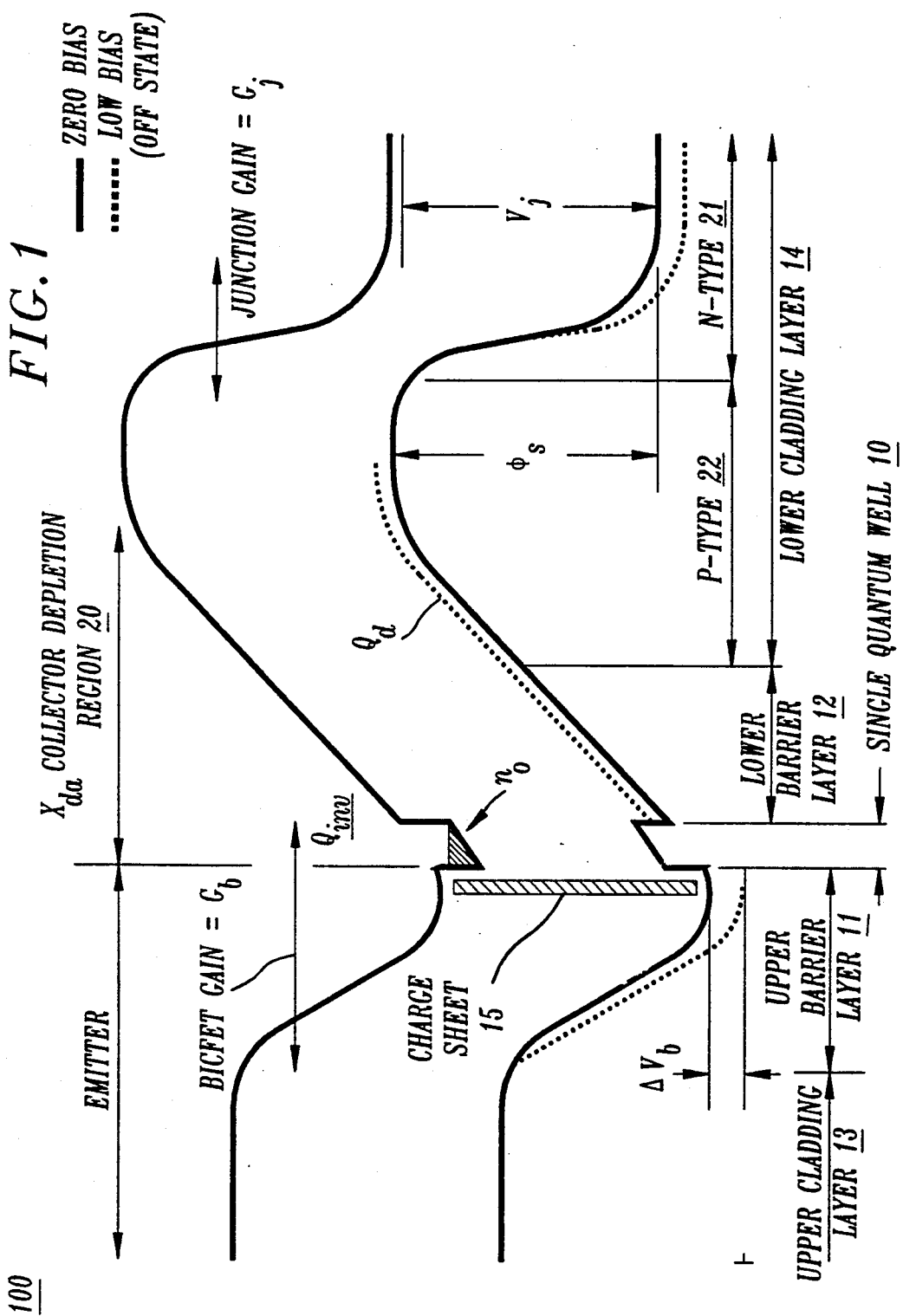
FIGS. 1-2 are energy band diagrams for a quantum well laser in accordance with the principles of the invention.

One exemplary embodiment of a device according to the principles of the invention is depicted in the energy band diagram of FIG. 1. While the description relates to the illustration of a structure via an energy band diagram, it should be understood, as is well known in the art, that this diagram is also analogous to a compositional profile for the same structure.

The structure shown is fabricated by conventional molecular beam epitaxy (MBE) growth techniques. This growth technique is well known to those skilled in the art and need not be described in detail here. While it appears that MBE to be the preferred growth technique because of the control it affords over layer thickness and compositions, other growth techniques are contemplated, such as MOCVD and the like. The graded change in compositional value, that is, the graded change in AlGaAs during growth may be accomplished under computer control.

Reference is now made to FIG. 1 illustrating an energy band diagram for a single quantum well laser 100 having a separate confinement heterostructure. Single quantum well laser 100 contains an active region having a single quantum well (SQW) 10. Upper and lower barrier layers 11 and 12, respectively, provide carrier confinement whereas upper and lower cladding layers 13 and 14, respectively, provide optical waveguiding of propagating radiation. It should be noted that barrier layers 11 and 12, single quantum well 10, and cladding layers 13 and 14 are intermediate band gap, narrow band gap and wide band gap semiconductor materials, respectively. Importantly, at the heterointerface of single quantum well 10 and barrier layer 11, a charge sheet 15 is placed therein such that an inversion layer at the heterointerface is produced identical in principle to that of the DOES disclosed in U.S. Pat. No. 4,806,997 and the bipolar inversion channel device disclosed in U.S. Pat. No. 4,800,415. The teachings of U.S. Pat. No. 4,800,415 are incorporated herein by reference. It should be noted that the formation of the inversion layer vis-a-vis the charge sheet is typically accomplished in part by charge deposition, such as ion implantation, molecular beam epitaxy, or other impurity doping methods. Typically, the depth of deposition from the interface is approximately less than 100 Å for a charge density of $10^{19}/cm^3$. It is, however, contemplated that the inversion layer can also be accomplished by choosing the wide and narrow band gap layers to have sufficiently different work functions, that is, different Fermi levels, so that inversion occurs.

As is known in the art, single quantum well 10 may comprise GaAs or $Al_xGa_{1-x}As$, where x is small value. Furthermore, cladding layers 13 and 14 may comprise $Al_zGa_{1-z}As$ and barrier layers 11 and 14 may comprise graded index $Al_yGa_{1-y}As$, wherein $z > x$ and y ranges between x and z, depending on the desired properties. It should be noted that the laser cavity obtains confinement in the vertical direction from the higher index of refraction material of cladding layers 13 and 14. Additionally, in accordance with the operation of the device, lower cladding layer 14 includes p-type conductivity region 22 and n-type conductivity region 21, which form a simple p-n junction.

Figure 2:
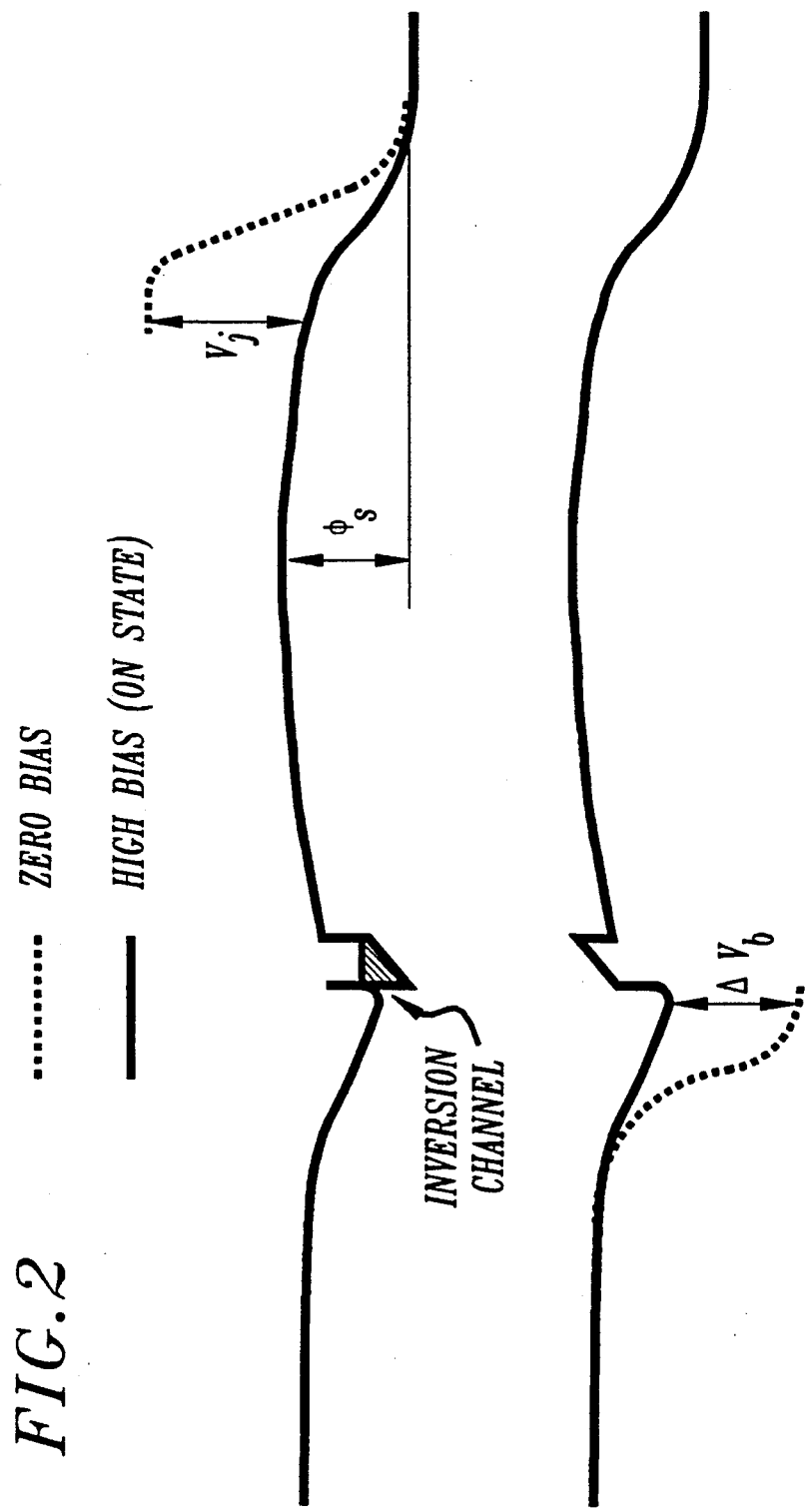

The operation of single quantum well laser 100 may be explained by referring simultaneously to FIGS. 1 and 2. In an OFF state, that is at low bias, almost all of the voltage across the device is dropped across the collector depletion region 20 having a length $x_{da}$, which consists of single quantum well 10, lower barrier layer 12 and portions of lower cladding layer 14. The current that flows in single quantum well laser 100 results from carriers produced in collector depletion region 20 multiplied by the gain, $G_b$, at the junction between barrier layer 11 and single quantum well 10 vis-a-vis charge sheet 15, and the gain, $G_j$ across the back diode junction formed by wide band gap cladding layers 22 and 21. In particular, the current flow $J_{nb}$ through the interface of single quantum well 10 and upper barrier layer 11 can mathematically be expressed in the following form:

$$J_{nb} = J_{nbo}(n_o/n_o^*)e^{\Delta V_b/kt}$$

where $J_{nbo}$ is the electron current flow in collector depletion region 20 at equilibrium, $n_o$ is the electron concentration, $n_o^*$ is the electron concentration at equilibrium, $\Delta V_b$ is the change in bias voltage on upper barrier layer 11, k is Boltzmann's constant, and t is the absolute temperature.

As indicated above, the current flow $J_{nb}$ through the depletion region is highly dependent on the electron concentration $n_o$. It should specifically be noted that the change in the bias voltage $\Delta V_b$ on upper barrier layer 11 is the result of extra charge which is added to collector 20 either in the form of the charge $Q_{inv}$ in the inversion channel or as charge $Q_d$ in the depletion region, as shown in FIG. 1. For low values of $J_{nb}$, i.e., below the switching state, the electron concentration $n_o$ is sufficiently small such that the inversion charge $Q_{inv}$ is less than the depletion charge $Q_d$. As such, the charge that is required to produce the change in bias voltage, $\Delta V_b$, is provided substantially, if not totally, by the depletion charge $Q_d$. As the current $J_{nb}$ increases with increasing bias voltage due to increased depletion charge $Q_d$ and inversion charge $Q_{inv}$, the electron concentration and the change in bias voltage $\Delta V_b$ across barrier layer 11 and single quantum well 10 interface grow rapidly. The increase in $n_o$ results due to a larger current flows into and out of single quantum well 10, yielding a larger carrier population therein.

At some voltage, $n_o$ becomes substantially large such that inversion charge $Q_{inv}$ in addition to depletion charge $Q_d$ provides biasing action to increase the barrier voltage $\Delta V_b$. However, the depletion charge $Q_d$ at this voltage is fairly large and, if $n_o$ continues to increase for increasing applied voltage, the total charge $Q_s = Q_{inv} + Q_d$ would exceed the the maximum charge $Q_o$ in the system. Hence, at some voltage level, the depletion charge $Q_d$ begins to decrease as the inversion charge $Q_{inv}$ increases in order to maintain conservation of charge. In mathematical terms, $d\phi_s/d(\Delta V_b)$ or $d\phi_s/dV_j$, where $V_j$ is the voltage across the p-n junction, must become negative because $\Delta V_b$ and $V_j$ are always monotonically increasing for increasing current flow. Importantly, the decreasing depletion charge $Q_d$ means a decreasing surface potential, that is a depletion width and, in turn, implies a negative differential resistance since the current is increasing with decreasing applied voltage. The negative resistivity terminates, as indicated in FIG. 2, when the value of $\phi_s$ has decreased to a value much less than its equilibrium level of $\phi_s^*$. At this point, the voltage $\Delta V_b$ across the barrier layer and quantum well junction and the voltage $V_j$ have increased sufficiently to accommodate the increase in current flow from a level just prior to switching. Once in the ON state, any additional applied voltage will be divided almost equally between the two junctions, leading to a substantial increase in current as $\phi_s$ approaches zero.

For high current levels, substantial recombination occurs which gives rise to strong electroluminescence as expected for a double heterostructure. With the formation of a suitable optical cavity, lasing action is obtained. Methods for forming the cavity, such as cleaving, are well known and need not be described in detail.

Figure 3:
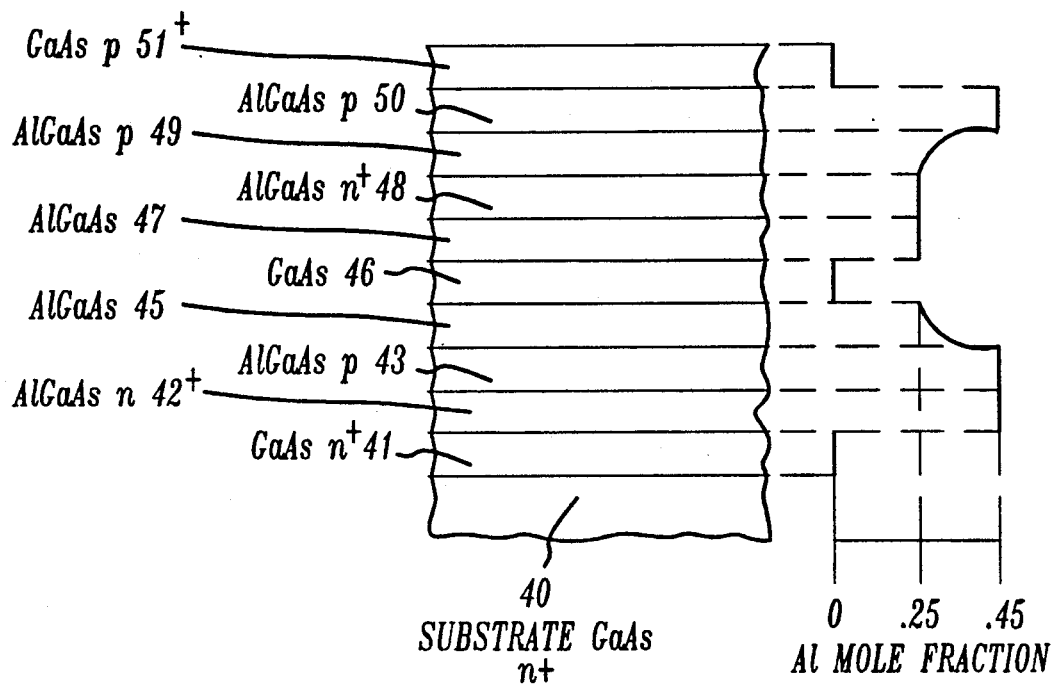
FIG. 3 is a growth sequence for an exemplary embodiment of the quantum well laser depicted in FIGS. 1-2.

Illustrated in FIG. 3 is an exemplary growth sequence for single quantum well laser 100 taken from experimental practice. Upon a n+-GaAs substrate 40, a 5000 Å thick n-GaAs (Si=$2 \times 10^{18} cm^{-3}$) buffer layer 41 is grown. Then, a p-n junction is formed by n-AlGaAs (Si=$2 \times 10^{18} cm^{-3}$) layer 42 and p-AlGaAs (Be=$5 \times 10^{17-3}$) layer 43, wherein the thicknesses of layers 42 and 43 are 7000 Å and 6000 Å, respectively. Subsequently, a single quantum well is formed by grading the ternary composition of deposited graded AlGaAs layer 45 (2000 Å thickness) down to an intermediate value, growing a 150 Å thick GaAs single quantum well 46, and then grading up the ternary composition of graded p-AlGaAs (Be=$1 \times 10^{17} cm^{-3}$, 2000 Å thickness) layer 49 from undoped buffer layer 47 (20 Å thickness). The AlGaAs growth is continued to provide optical cladding confinement (Be=$5\times10^{17}$cm$^{-3}$, 1.3 μm thickness) layer 50 and a heavily p-doped GaAs (Be=$5\times10^{19}$cm$^{-3}$, 500 Å thickness) cap layer 51 is grown to facilitate ohmic contact thereto. Importantly, at the heterointerface of GaAs single quantum well 46 and upper barrier layer 49, an n-type ($5\times10^{18}$cm$^{-3}$), 40 Å thick charge sheet 48 is formed within barrier layer 49. The inclusion of charge sheet 48, which becomes fully depleted at equilibrium, produces an inversion channel within quantum well 46. This inversion channel acts as an induced base for the device and leads directly to the switching action thereof. Moreover, graded barrier layer 49 and cladding layer 50 act as an emitter while single quantum well 46, lower barrier layer 12 and portions of lower cladding layer 45 act as a collector.

Figure 4:
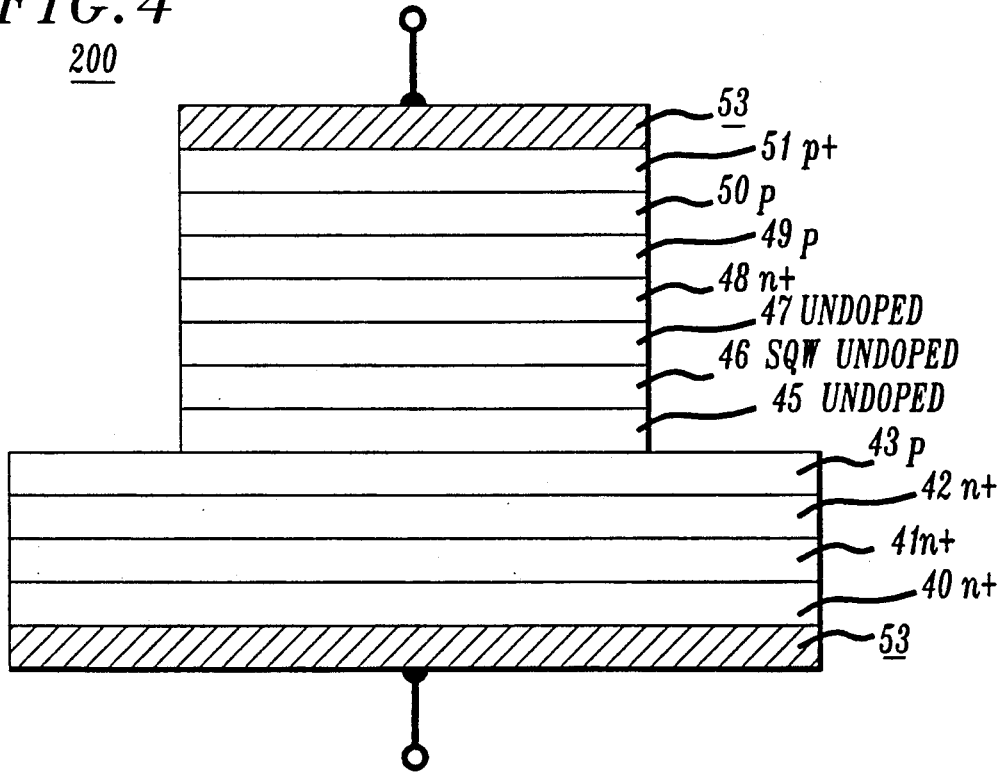
FIG. 4 is a front sectional view showing a quantum well laser fabricated by the growth sequence illustrated in FIG. 3.

After the growth process, the fabricated structure was metallized using thermally evaporated TiAu for a p-contact. Contact 52 was patterned in a stripe having a width between 50 to 90 μm. Using TiAu contact 52 as a mask, mesas were then etched to clear the p-n junction to about a depth of 2 μm. Finally, the wafer was thinned and metallized with AuGeNi to form a n-type ohmic substrate contact 53 and, subsequently, cleaved into a bar. Illustrated in FIG. 4, is the final device structure of single quantum well laser 200 fabricated according to the process above herein.

It will be readily appreciated that other material may be used. For example, other Group III-V compound semiconductors or Group II-VI compound semiconductors may be used. Furthermore, the dimensions given above are exemplary only and for many purposes may be varied for optimization of the device characteristics with respect to the particular application contemplated.

Figure 5:
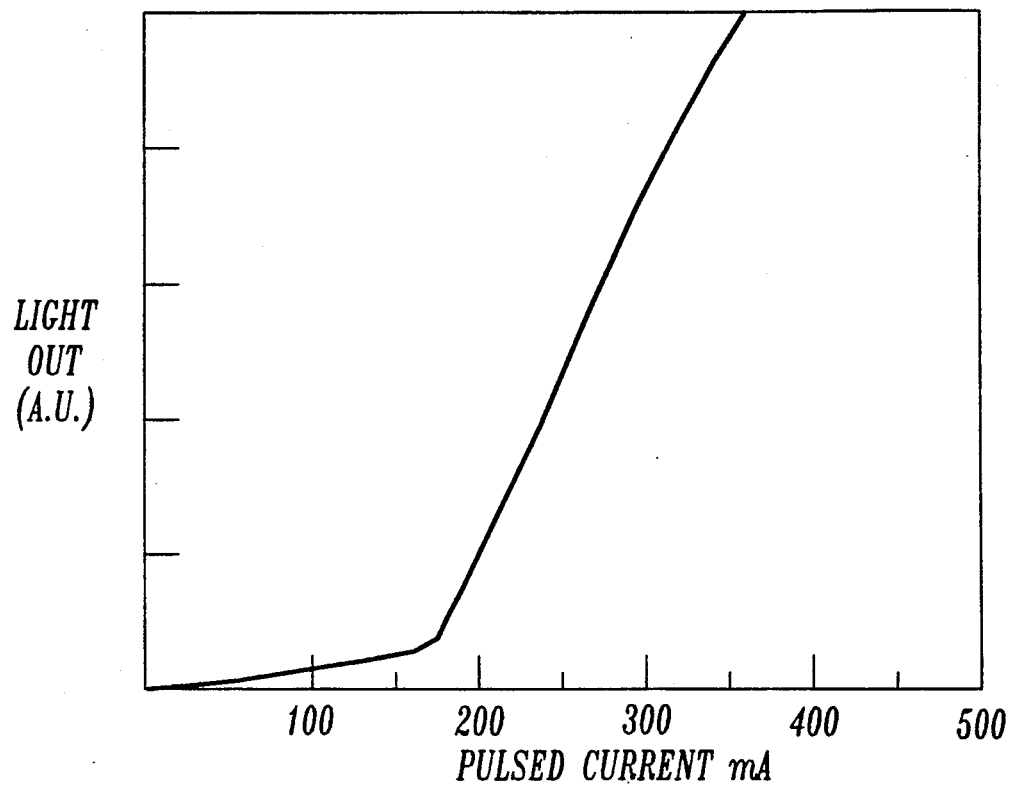
FIG. 5 shows an exemplary light output versus current pulse characteristics for the quantum well laser illustrated in FIG. 4.

The switching characteristic for single quantum well laser 200, which has a dimension of 300 μm×70 μm, indicate that quantum well laser 200 exhibits a switching voltage and current density of 12 V and 0.04 A cm$^{-2}$ and a holding voltage and current density of 1.8 V and 3.3 A cm$^{-2}$, respectively. Theoretical calculations indicate that these parameters are almost ideal and are believed to substantially result from the high quality of the AlGaAs in both the confinement and p-n junction layers, which were grown by high temperature MBE. Further measurements were made for devices having varying cavity lengths. In particular, the lasers were biased into the On state at about 2 mA with 0.5 μsec pulses (duty cycle~1 KHz). A typical light output profile is shown in FIG. 5. It should be noted that threshold current densities down to $J_{th}$=580 A/cm$^2$ were obtained for device lengths of ~650 μm, with slope efficiency as low as 0.35 mA/mW.

Figure 6:
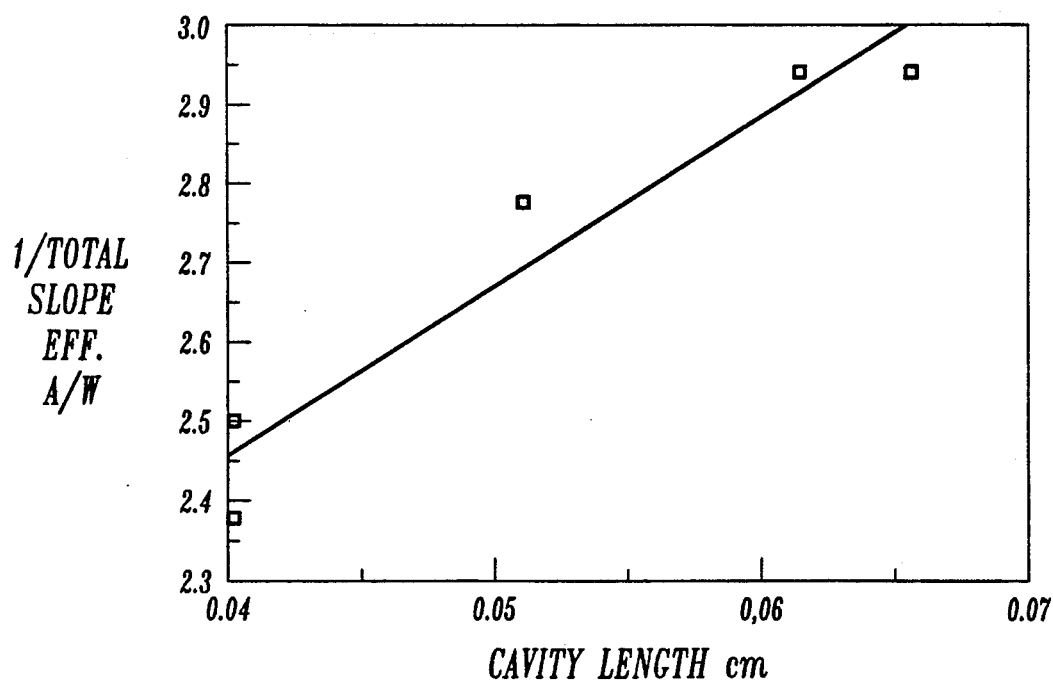
FIG. 6 shows the slope efficiency versus cavity length characteristic for quantum well laser shown in FIG. 4.

Utilizing the following relationship, $$\eta = \frac{\eta_c}{1 + \alpha L/\ln(1 + R)}$$

the variation of the differential quantum efficiency $\eta$ with cavity length L yielded a loss per unit length $\alpha \sim 11$ cm$^{-1}$, where $\eta_c$ is the electrical confinement factor and R is the facet reflectivity. The efficiency for different devices of different lengths are plotted in FIG. 6. From the intercept at L=0, the electrical confinement factor $\eta_c$ was estimated to be 0.42. It is anticipated that this value may be improved by increasing the Al mole fraction in the confinement regions coupled with narrower well widths.

Measurements indicate that the power conversion efficiency of the single quantum well laser to be about 45%, including both facets. By dividing the quantum efficiency $\eta$ by the total voltage applied to the device, it is possible to include the power dissipated in the non-emitting region, that is the p-n junction. Theoretically, the effects of this junction may be estimated using the applied voltage equation $V_H = \Delta V_b + V_j + \phi_s - \phi_s^*$, where $V_H$ is the applied voltage at the holding condition. For example, from numerical simulation, it was determined that for the ON state $\Delta V_b = 1.04$ V, $V_j = 1.57$ V, $\phi_s \sim 0.38$ and $\phi_s^* \sim 1.1$ V, yielding $V_H \sim 1.9$ V, which are in agreement with experimental results. Accordingly, the power dissipated in the device is about 80% in the p-n junction because the voltage drop across the upper barrier and quantum well junction is 0.32 V. Hence, in effect, the increase in $\Delta V_b$ is almost totally compensated for by the decrease in $\phi_s$.

It is understood that various other modifications will be readily apparent to those skilled in the art without departing from the scope and spirit of this invention. Accordingly, it is not intended that the scope of the claims appended hereto be limited to the description set forth herein, but rather that the claims be construed as encompassing all the features of patentable novelty that reside in the present invention, including all features that would be treated as equivalents thereof by those skilled in the art to which this invention pertains.

We claim:

1. In a laser comprising a quantum well region forming first and second heterojunction interfaces with upper and lower carrier confinement regions, respectively, the improvement comprising
   a charge sheet formed substantially near said first heterojunction interface and within said upper carrier confinement region such that an inversion layer is produced in said quantum well region, said quantum well region being substantially undoped, said upper and lower carrier confinement regions having a first conductivity type, said charge sheet having a second conductivity type opposite to said first conductivity type, and said charge sheet having a doping concentration sufficiently greater than said upper carrier confinement region for producing said inversion layer.

2. A laser according to claim 1 wherein said charge sheet is within 100 Å from said interface.

3. A laser according to claim 2 wherein said charge sheet has doping concentration within the range from approximately 10$^{17}$/cm$^3$ to approximately 10$^{19}$/cm$^3$.

4. A laser according to claim 1 wherein said upper and lower carrier confinement regions are graded index layers.

5. A laser according to claim 4 further comprising upper and lower cladding regions having first and second interfaces with said upper and lower carrier confinement regions, respectively, and said lower cladding region including a p-n junction.

6. A laser according to claim 5 wherein said upper and lower carrier confinement regions are intermediate energy band gap materials, said single quantum well is a narrow energy band gap semiconductor material and said upper and lower cladding regions are wide energy band gap semiconductor materials.

7. A laser according to claim 6 wherein said upper and lower confinement regions have a P-conductivity type.

8. A laser according to claim 7 further comprising first and second electrical contacts to said upper and lower cladding regions, respectively.

9. A laser according to claim 8 wherein said quantum well region includes semiconductor material consisting of group III-V compounds.

* * * * *